(12) United States Patent
Dechene et al.

(10) Patent No.: US 12,400,871 B2
(45) Date of Patent: Aug. 26, 2025

(54) METAL LINES WITH LOW VIA-TO-VIA SPACING

(71) Applicant: INTERNATIONAL BUSINESS MACHINES CORPORATION, Armonk, NY (US)

(72) Inventors: Daniel James Dechene, Watervliet, NY (US); Somnath Ghosh, Clifton Park, NY (US); Hsueh-Chung Chen, Cohoes, NY (US); Carl Radens, LaGrangeville, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 495 days.

(21) Appl. No.: 16/795,718

(22) Filed: Feb. 20, 2020

(65) Prior Publication Data

US 2021/0265166 A1 Aug. 26, 2021

(51) Int. Cl.
*H01L 21/311* (2006.01)
*H01L 21/033* (2006.01)
*H01L 21/768* (2006.01)

(52) U.S. Cl.
CPC .... *H01L 21/31144* (2013.01); *H01L 21/0337* (2013.01); *H01L 21/76816* (2013.01)

(58) Field of Classification Search
CPC ...... H01L 21/027–0338; H01L 21/768–76898
See application file for complete search history.

(56) References Cited

U.S. PATENT DOCUMENTS

| | | |
|---|---|---|
| 5,882,996 A | 3/1999 | Dai |
| 8,361,704 B2 | 1/2013 | Colburn et al. |
| 8,813,012 B2 | 8/2014 | Rieger et al. |
| 8,895,445 B2 * | 11/2014 | Hsieh ............... H01L 21/31138 438/700 |
| 8,992,792 B2 | 3/2015 | Chang et al. |
| 9,418,935 B1 | 8/2016 | Shao et al. |
| 9,991,156 B2 | 6/2018 | Burns et al. |
| 10,020,223 B1 | 7/2018 | Anderson et al. |
| 10,157,789 B2 | 12/2018 | Chen et al. |

(Continued)

OTHER PUBLICATIONS

Lee et al., "SAQP spacer merge and EUV self-aligned block decomposition at 28nm metal pitch on imec 7nm node", Design-Process-Technology Co-optimization for Manufacturability XIII. Volume 10962. Mar. 20, 2019. (pp. 109620N-1-10962-8.).

(Continued)

*Primary Examiner* — Kevin Parendo
(74) *Attorney, Agent, or Firm* — Tutunjian & Bitetto, P.C.; Robert Richard Aragona (57) ABSTRACT

A method is presented for employing double-patterning to reduce via-to-via spacing. The method includes forming a mandrel layer over a substrate, forming sacrificial hardmask layers over the mandrel layer defining a litho stack, creating a pattern in the litho stack, the pattern having a narrow section connecting two wider sections to define a substantially hour-glass shape, depositing a spacer assuming a shape of the pattern, and etching the litho stack to expose the mandrel layer and metal lines, wherein the metals lines define sharp distal ends reducing a distance between the metal lines.

16 Claims, 8 Drawing Sheets

(56) References Cited

U.S. PATENT DOCUMENTS

| | | | |
|---|---|---|---|
| 10,177,031 B2 | 1/2019 | Bao et al. | |
| 2005/0227424 A1* | 10/2005 | Oh | H10D 30/62 |
| | | | 257/E29.021 |
| 2008/0299773 A1* | 12/2008 | Watanabe | H01L 21/3083 |
| | | | 438/694 |
| 2011/0111348 A1* | 5/2011 | Schultz | H01L 21/76895 |
| | | | 430/312 |
| 2013/0023119 A1* | 1/2013 | Park | H01L 21/31144 |
| | | | 257/E21.585 |
| 2015/0200110 A1 | 7/2015 | Li et al. | |
| 2015/0243515 A1* | 8/2015 | Yuan | H01L 21/3088 |
| | | | 438/666 |
| 2017/0243818 A1* | 8/2017 | Aburada | H01L 21/31144 |
| 2018/0204794 A1* | 7/2018 | Xu | H01L 23/528 |
| 2019/0164887 A1* | 5/2019 | Wang | H01L 23/5283 |

OTHER PUBLICATIONS

Pan et al., "Pushing Multiple Patterning in Sub-10nm: Are We Ready?", 52nd ACM/EDAC/IEEE Design Automation Conference. Jun. 8, 2015. (pp. 1-6.).

* cited by examiner

METAL LINES WITH LOW VIA-TO-VIA SPACING

BACKGROUND

The present invention relates generally to semiconductor devices, and more specifically, to double patterning techniques enabling via-to-via spacing reduction without the need for an additional masking (cut) layer.

Semiconductor device manufacturing includes various steps such as a patterning process. For example, the manufacturing of a semiconductor chip can start with computer aided design (CAD) generated device patterns and can continue with the effort to replicate these device patterns in a substrate in which semiconductor devices can be formed. The replication process can involve the use of a photolithography process in which a layer of photo-resist material can be first applied on top of a substrate, and then be selectively exposed according to a predetermined device pattern. Portions of the photo-resist that are exposed to light or other ionizing radiation (e.g., ultraviolet, electron beams, etc.) can experience some changes in their solubility to a certain solution. Next, the photo-resist can be developed in a developer solution, thereby removing the non-irradiated (in a negative resist) or irradiated (in a positive resist) portions of the resist layer, to create a photo-resist pattern. The photo-resist pattern can subsequently be copied or transferred to the substrate underneath the photo-resist pattern.

SUMMARY

In accordance with an embodiment, a method is provided for employing double-patterning to reduce via-to-via spacing. The method includes forming a mandrel layer over a substrate, forming sacrificial hardmask layers over the mandrel layer defining a litho stack, creating an hour-glass pattern in the litho stack, depositing a spacer assuming an hour-glass pattern shape, and etching the litho stack to expose the mandrel layer and metal lines, wherein the metals lines define sharp distal ends reducing a distance between the metal lines.

In accordance with another embodiment, a method is provided for employing double-patterning to reduce via-to-via spacing without an additional masking layer. The method includes creating an hour-glass pattern in a litho stack formed over a substrate, depositing a spacer assuming an hour-glass pattern shape, and etching the litho stack to expose metal lines defining sharp distal ends reducing a distance between the metal lines.

In accordance with yet another embodiment, a semiconductor device is provided for employing double-patterning to reduce via-to-via spacing without an additional masking layer. The semiconductor device includes a pair of sharp tip-to-tip oriented metal lines with a via disposed at respective distal ends and a spacer disposed between the pair of sharp tip-to-tip oriented metal lines, wherein the spacer is pinched off between the pair of sharp tip-to-tip oriented metal lines to electrically isolate the pair of sharp tip-to-tip oriented metal lines.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for denser active via spacing without use of a cut mask. The exemplary embodiments employ double patterning techniques to achieve denser active via spacing. Double patterning is a technique used in the lithographic process that defines the features of integrated circuits at advanced process nodes. Double patterning enables designers to develop chips for manufacture on sub-30 nm process nodes by employing current optical lithography systems. One downside of using double patterning includes the increase of mask and lithography costs. This affects the complexity of the design process and the performance, variability, and density of the resultant devices.

The exemplary embodiments of the present invention address and alleviate such issues by creating a merged spacer that defines dense tip-to-tip and tip-to-side constructs, without the need for additional masking levels. In particular, via-via spacing and via on a tip-horizontal rail spacing are two main design features in back-end-of-the-line (BEOL) processing. Reduction in these two ground rules allows for compaction (e.g., area scaling). Existing solutions are limited in terms of lithographic patterning (minimum tip-to-side and minimum tip-to-tip printing) and cannot achieve the necessary rule reduction, and thus, compaction necessary. The use of cut masks can be employed to achieve the necessary compaction. However, the use of cut masks requires an additional photomask, which adds to the cost of semiconductor manufacturing.

Embodiments in accordance with the present invention provide methods and devices for employing a method to modify design data to create a merged spacer that defines dense tip-to-tip and tip-to-side constructs without the need for an additional masking level. Thus, minimum via-to-via spacing and minimum via-to-rail spacing can be achieved. The benefits of the exemplary embodiments of the present invention include reduction in use of number of masking levels, defining critical rules for tip-to-tip and tip-to-side by a spacer deposition process, as opposed to direct line end patterning, and defining the minimum space by a spacer which provides for better reliability.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
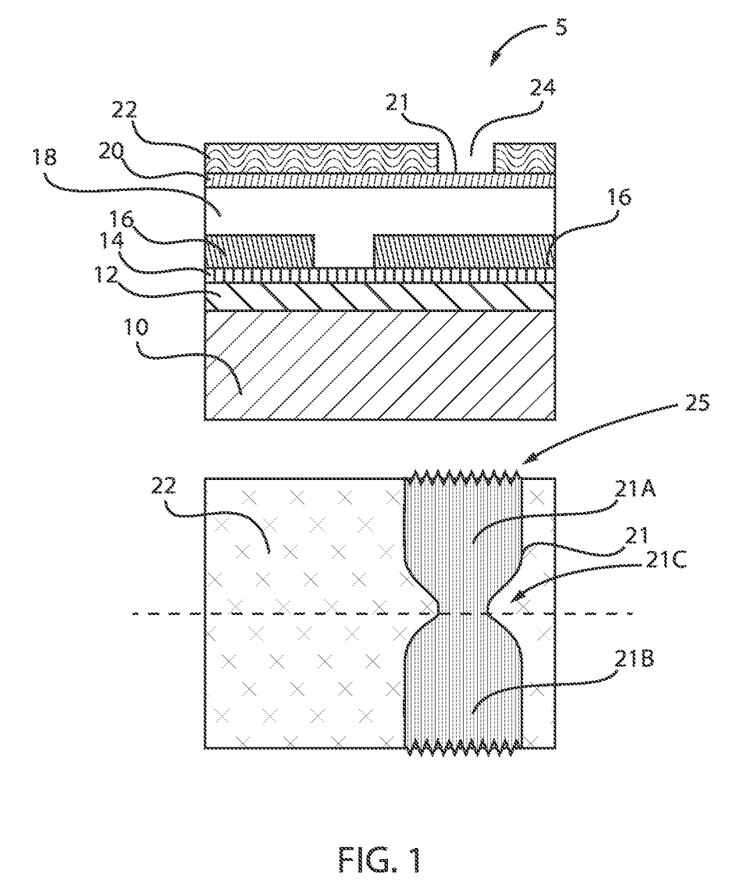
FIG. 1 is a cross-sectional view of a semiconductor structure for spacer assisted litho-etch litho-etch (LELE) where an hour-glass pattern in created in the litho stack, in accordance with an embodiment of the present invention.

FIG. 1 is a cross-sectional view of a semiconductor structure for spacer assisted litho-etch litho-etch (LELE) where an hour-glass pattern in created in the litho stack, in accordance with an embodiment of the present invention.

A semiconductor structure 5 includes a barrier layer 12 formed over a substrate 10. A cap layer 14 is formed over the barrier layer 12. A layer 16 of amorphous silicon (a-Si) is formed over the cap layer 14. The layer 16 can be referred to as a mandrel layer. Three hardmask layers 18, 20, 22 can be formed over the mandrel layer 16. An opening 24 can be formed within the third hardmask layer 22 to expose a top surface 21 of the second hardmask layer 20.

Top view 25 illustrates the creation of a substantially hour-glass shape pattern 21 in the litho stack. The hourglass pattern 21 defines a top section 21A, a bottom section 21B, and a central section 21C. The central section 21C is the curved section and can be referred to as a merged section. The top section 21A and the bottom section 21B are wider than the middle section 21C. In other words, the middle section 21C is narrower than the top and bottom sections 21A, 21B. The narrow section 21C thus connects the wider sections 21A, 21B. The pattern 21 extends to a top surface and bottom surface of the third hardmask 22. In fact, the pattern 21 extends beyond the top and bottom surfaces of the third hardmask 22. The serrated lines or jagged edges or surfaces indicate the continuation of pattern 21. The serrated lines or jagged edges or surfaces are also shown in FIGS. 2-8.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

Examples of materials that can be used as diffusion barrier 12 include, for example, Ta, TaN, Ti, TiN, Ru, RuN, RuTa, RuTaN, IrTa, IrTaN, W, WN or a multilayered stack thereof. The thickness of the diffusion barrier 12 can vary depending on the deposition process used as well as the material employed. Usually, the barrier layer 12 has a thickness from 4 nm to 40 nm, with a thickness from 7 nm to 20 nm being more preferable. The barrier layer 12 can be formed by a deposition process including, for example, CVD, PECVD, PVD, sputtering and plating.

In one example, the barrier layer 12 is titanium nitride (TiN).

The cap layer 14 can be an insulating material containing nitrogen. In one or more embodiments, the cap layer 14 can be SiN, SiCN, SiCNH, SiC, or SiNO. The cap layer 14 can be deposited at a thickness of about 10 nanometers (nm) to about 100 nm. The cap layer 14 can be any type of sacrificial nitride material.

In one example, the cap layer 14 is silicon nitride (SiN).

The mandrel layer 16 can include, e.g., amorphous silicon (a-Si). In other example embodiments, the mandrel layer 16 can include amorphous silicon (a-Si:H), amorphous silicon carbon (a-SiC), amorphous hydrogenated silicon carbon (a-SiC:H) and combinations thereof including combinations with amorphous silicon (a-Si).

The mandrel layer 16 can be formed using a deposition process, such as chemical vapor deposition, e.g., plasma enhanced chemical vapor deposition (PECVD).

The mandrel layer 16 can have a thickness ranging from 2 nm to 50 nm.

The first hardmask layer 18 can include a spin-on-hardmask (SOH), which is usually made of an amorphous carbon (a-C) or similar.

The second hardmask layer 20 can include a nitride, such as SiN or SiON. In one example, layer 20 is SION.

The third hardmask layer 22 can include a nitride, such as SiN or SiON. In one example, layer 22 is SiN.

Figure 2:
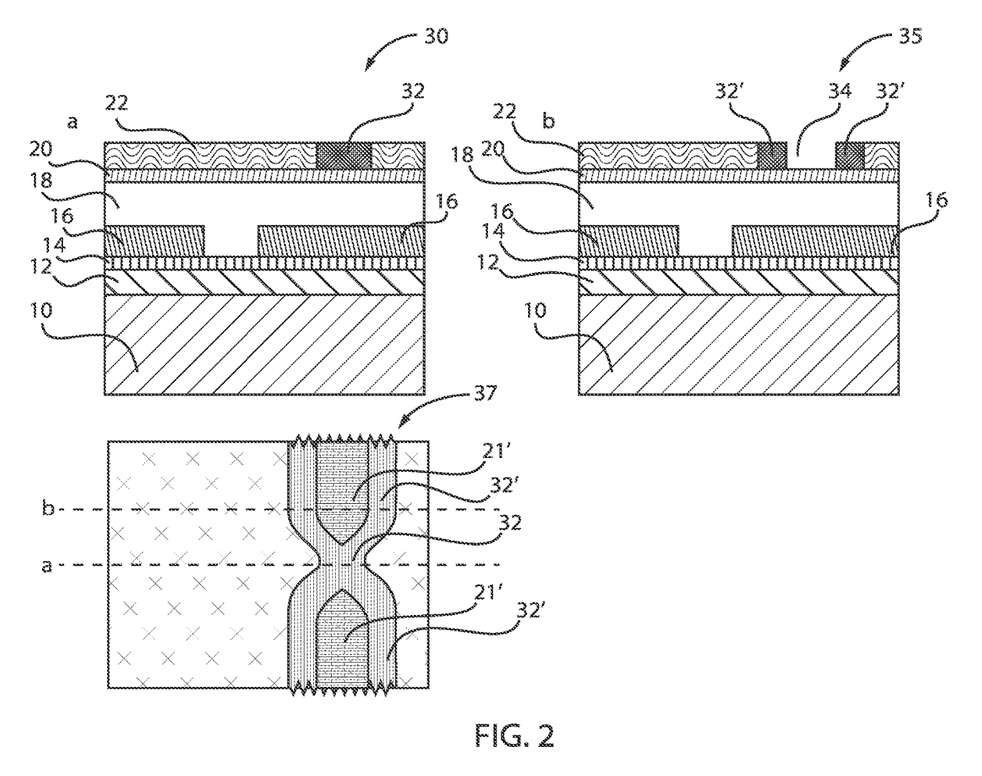
FIG. 2 is a cross-sectional view of the semiconductor structure of FIG. 1 where a spacer is deposited, the spacer assuming an hour-glass shape, in accordance with an embodiment of the present invention.

FIG. 2 is a cross-sectional view of the semiconductor structure of FIG. 1 where a spacer is deposited, the spacer assuming an hour-glass shape, in accordance with an embodiment of the present invention.

In various example embodiments, a spacer 32 is deposited. In structure 30, the spacer 30 is deposited by, e.g., ALD, and it etched back. In structure 35, the spacer sections 32' are illustrated and an opening 34 remains.

Figure 5:
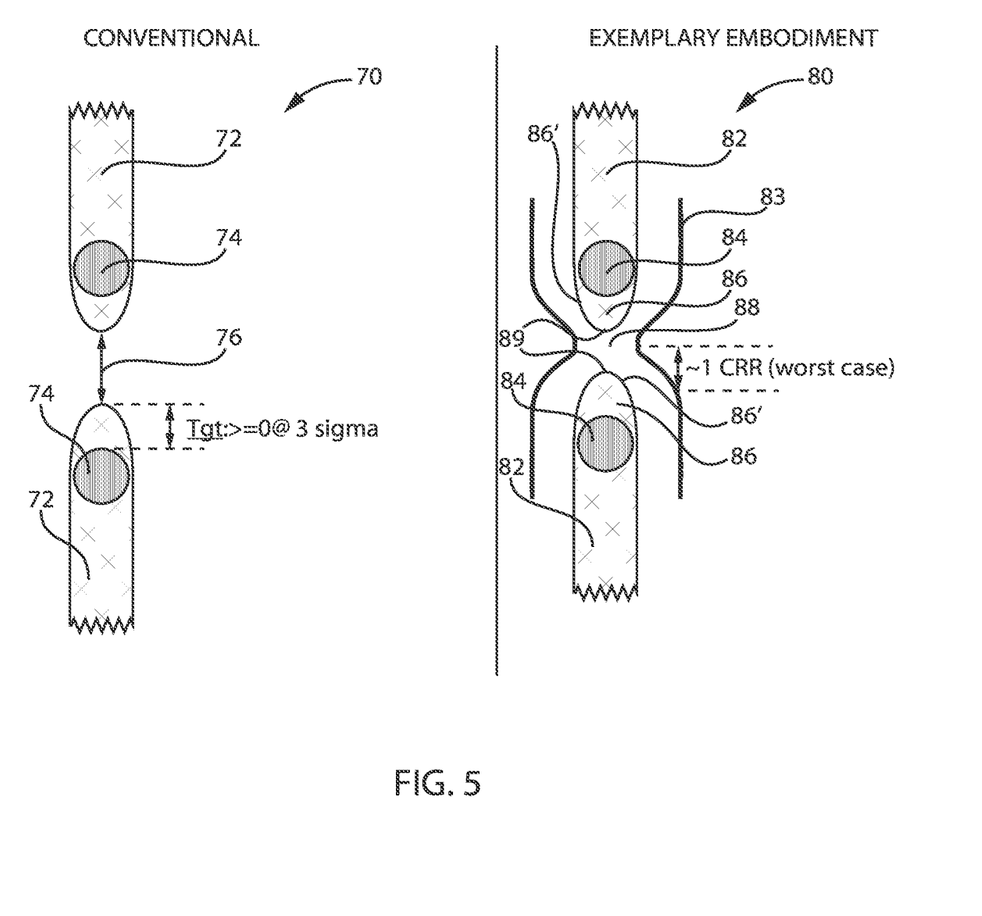
FIG. 5 is a top view illustrating via-via spacing, in accordance with an embodiment of the present invention.
Figure 6:
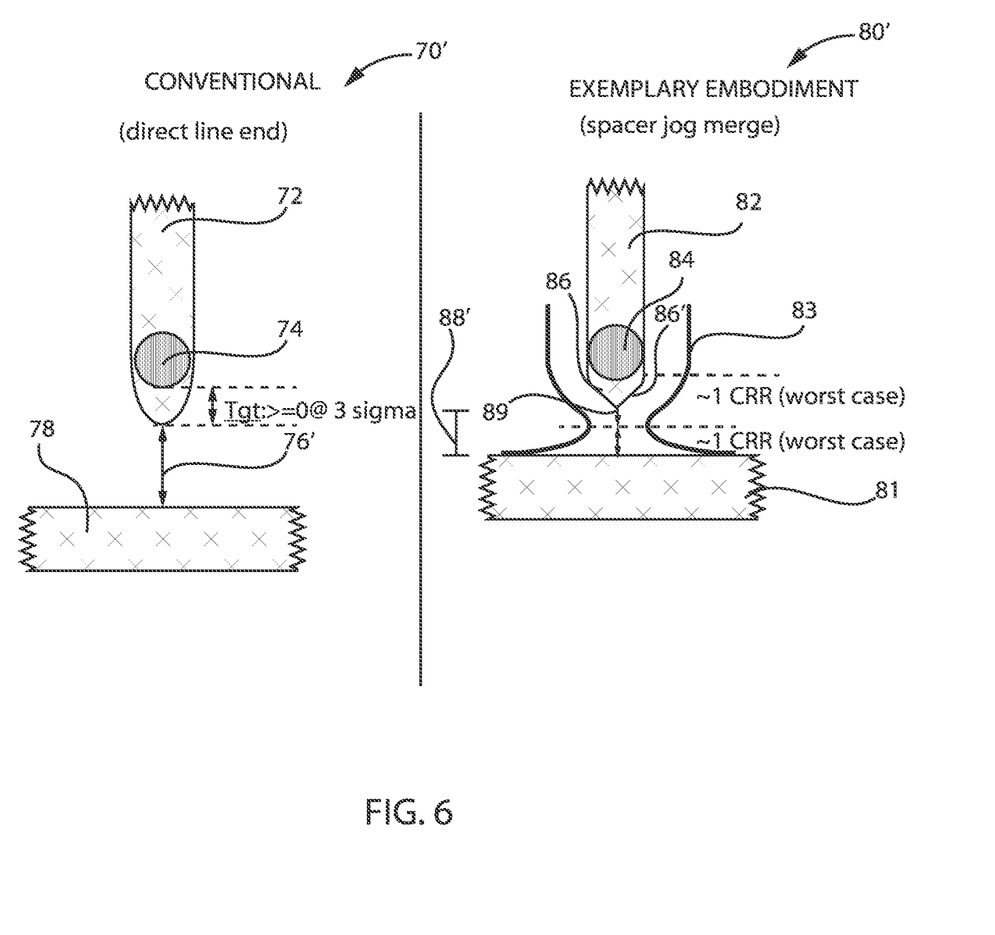
FIG. 6 is a top view illustrating via-side rail spacing, in accordance with an embodiment of the present invention.

Top view 37 illustrates the spacer 32, as well as the spacer sections 32'. Top surface sections 21' of the second hardmask layer 20 are also visible. Thus, the spacer 32 has an hour-glass shape where two sections 21' are visible. The spacer 32 can be referred to as a merged spacer. The spacer 32 is merged because the spacer sections 32' merge at section 21C. The spacer 32 is merged in the regions where the combined patterning target is created to enable isolation between metal lines (FIGS. 5 and 6). The spacer 32 is a dielectric that electrically isolates the distal ends of the metal lines.

Additionally, tip-to-tip rules and tip-to-side rules are defined by the deposition of the spacer 32. The minimum spacer between the metal lines (FIGS. 5 and 6) can thus be defined by the deposition of the spacer 32.

The spacer layer 32, in this example, is a silicon nitride (SiN) thin film, which is conformally coated over the litho stack. However, the spacer layer 32 can also be other suitable materials such as another nitride, an oxide, such as titanium oxide (TiO2), or similar.

The spacer layer 32 can be applied by a deposition process, such as an atomic layer deposition (ALD) process, which can precisely control the spacer layer thickness. In this embodiment, the spacer layer thickness is controlled to substantially about 15-30 nm.

Figure 3:
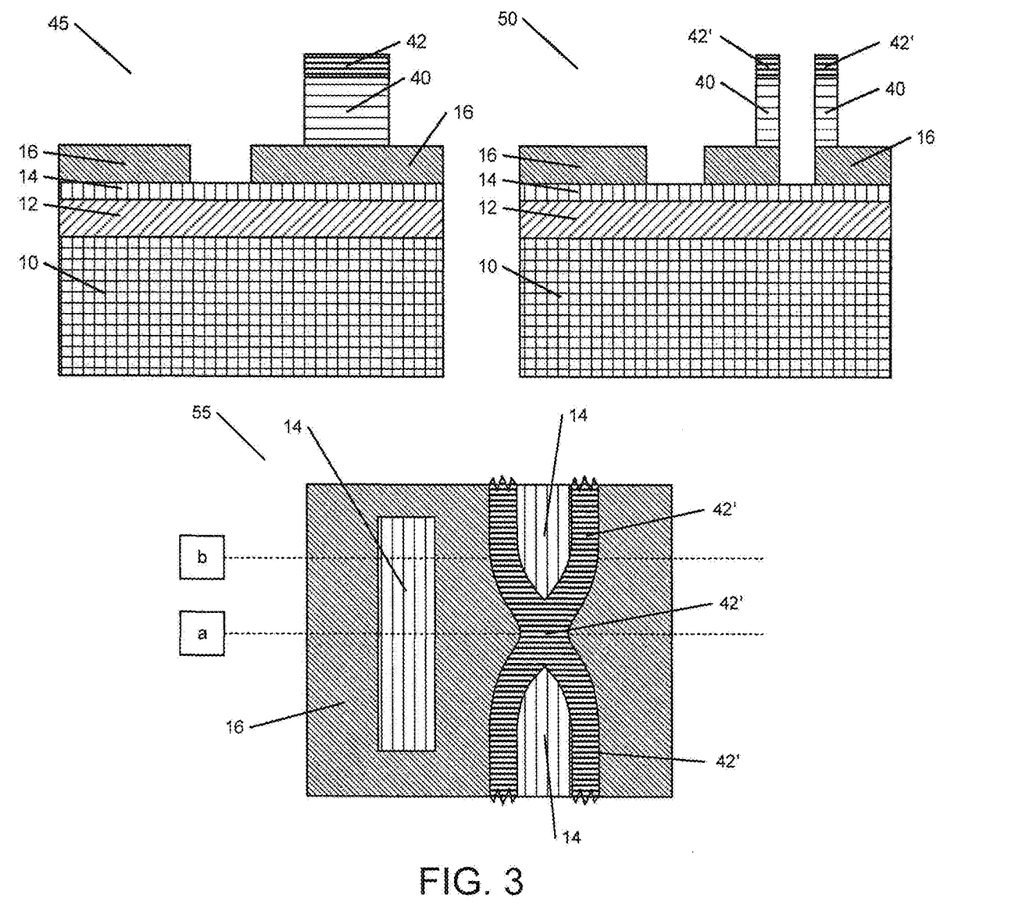
FIG. 3 is a cross-sectional view of the semiconductor structure of FIG. 2 where the litho stack is etched to expose the mandrel layer, in accordance with an embodiment of the present invention.

FIG. 3 is a cross-sectional view of the semiconductor structure of FIG. 2 where the litho stack is etched to expose the mandrel layer, in accordance with an embodiment of the present invention.

In various example embodiments, the hardmask layers 18, 20, 22 are etched to expose the mandrel layer 16. In structure 45, a portion 40 of the hardmask layer 18 and a portion 42 of hardmask layer 20 remain intact. These portions 40, 42 correspond to the location of the spacer 32. Similarly, in structure 50, a portion 40 of the hardmask layer 18 and a portion 42' of hardmask layer 20 remain intact. These portions 40, 42' correspond to the location of the spacer sections 32'.

Top view 55 illustrates the portion 42 of hardmask layer 20, as well as the portions 42' of the hardmask layer 20. The portions 42, 42' define an hour-glass shape.

Figure 4:
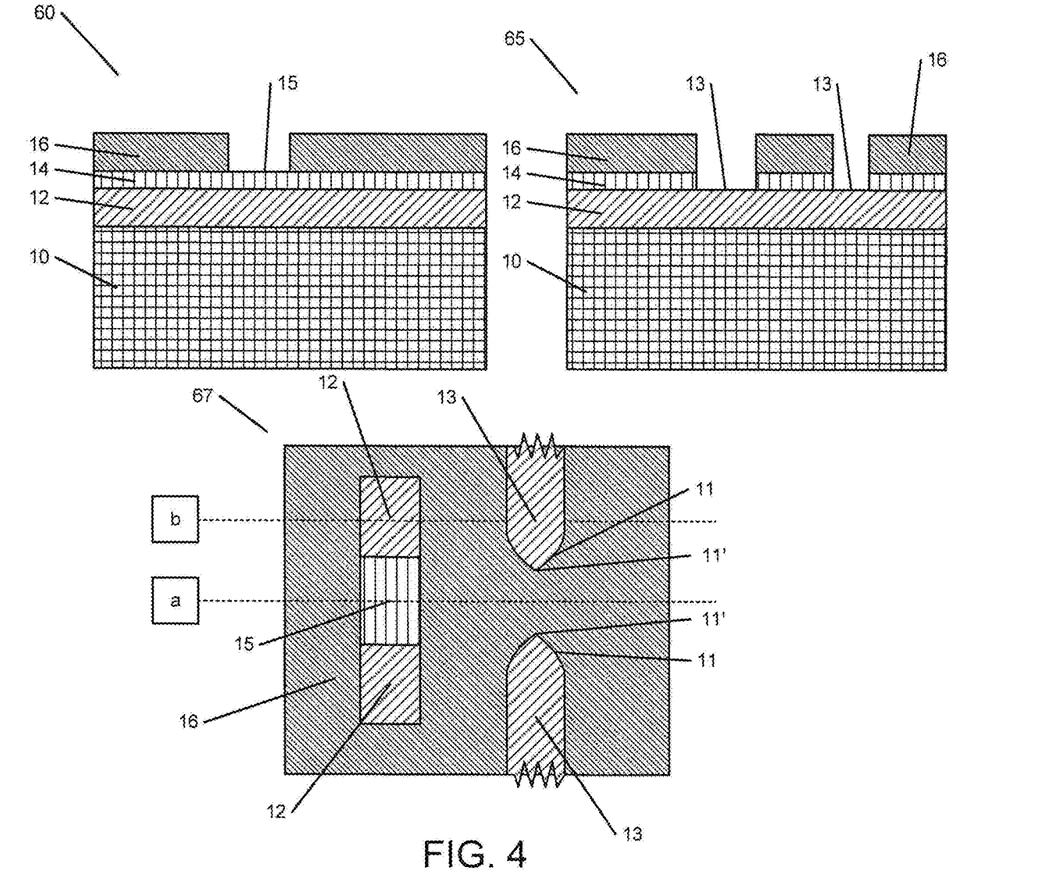
FIG. 4 is a cross-sectional view of the semiconductor structure of FIG. 3 where all the hardmasks are removed to expose the top surface of the mandrel layer, in accordance with an embodiment of the present invention.

FIG. 4 is a cross-sectional view of the semiconductor structure of FIG. 3 where all the hardmasks are removed to expose the top surface of the mandrel layer, in accordance with an embodiment of the present invention.

In various example embodiments, the portions 40, 42, 42' are stripped to fully expose the mandrel layer 16. In structure 60, a top surface 15 of the SiN layer 14 is exposed and, in structure 65, an area 13 of a top surface of the metal TiN layer 12 is exposed.

Top view 67 illustrates the new shape. The exposed area 13 defines a pointed or sharp distal end 11'. The side surfaces 11 of the exposed area 13 are also configured to be more oblique or diagonal or inclined or slanted or skewed in nature. Additionally, the tip-to-tip distance is shortened. In other words, the exposed areas 13 are closer to each other due to the sharped end configuration of the exposed areas 13.

FIG. 5 is a top view illustrating via-via spacing, in accordance with an embodiment of the present invention.

In a conventional design, in structure 70, the metal lines 72 each include a via 74. In one example, the tip-to-tip distance 76 between the metal lines 72 can be about 51.7 nm.

In various example embodiments, in structure 80, the metal lines 82 each include a via 84. The distal end 86 of the metal line 82 defines a pointed or sharp tip or end 89 and inclined surfaces 86'. A distance between the sharp tips or ends 89 is less than the distance 76 in the conventional design. In one example, the tip-to-tip distance between the metal lines 82 can be about 39.4 nm. Bold lines 83 illustrate the jog or notch created at the distal ends 86 of the metal lines 82. The distance between the tips is designated as 88.

The worst case corner rounding radius (CRR) is approximately 1. The spacer 32 (of FIG. 2) is thus a dielectric that can electrically isolate the distal sharp tips 89 of the metal lines 82.

FIG. 6 is a top view illustrating via-side rail spacing, in accordance with an embodiment of the present invention.

In a conventional design, in structure 70', the metal line 72 is a distance 76' from the rail 78. The metal line includes a via 74. In one example, the distance 76' can be, e.g., 41.1 nm.

In various example embodiments, in structure 80', the metal line 82 has a via 84 and is a distance 88' from the rail 81. In one example, the distance 88' can be 34.7 nm. Thus, the sharp tip or end 89 of the distal end 86 of the metal line 82 is less than that in conventional designs. The worst case CRR is approximately 2. Bold lines 83 illustrate the jog or notch created at the distal ends 86 of the metal lines 82.

Figure 7:
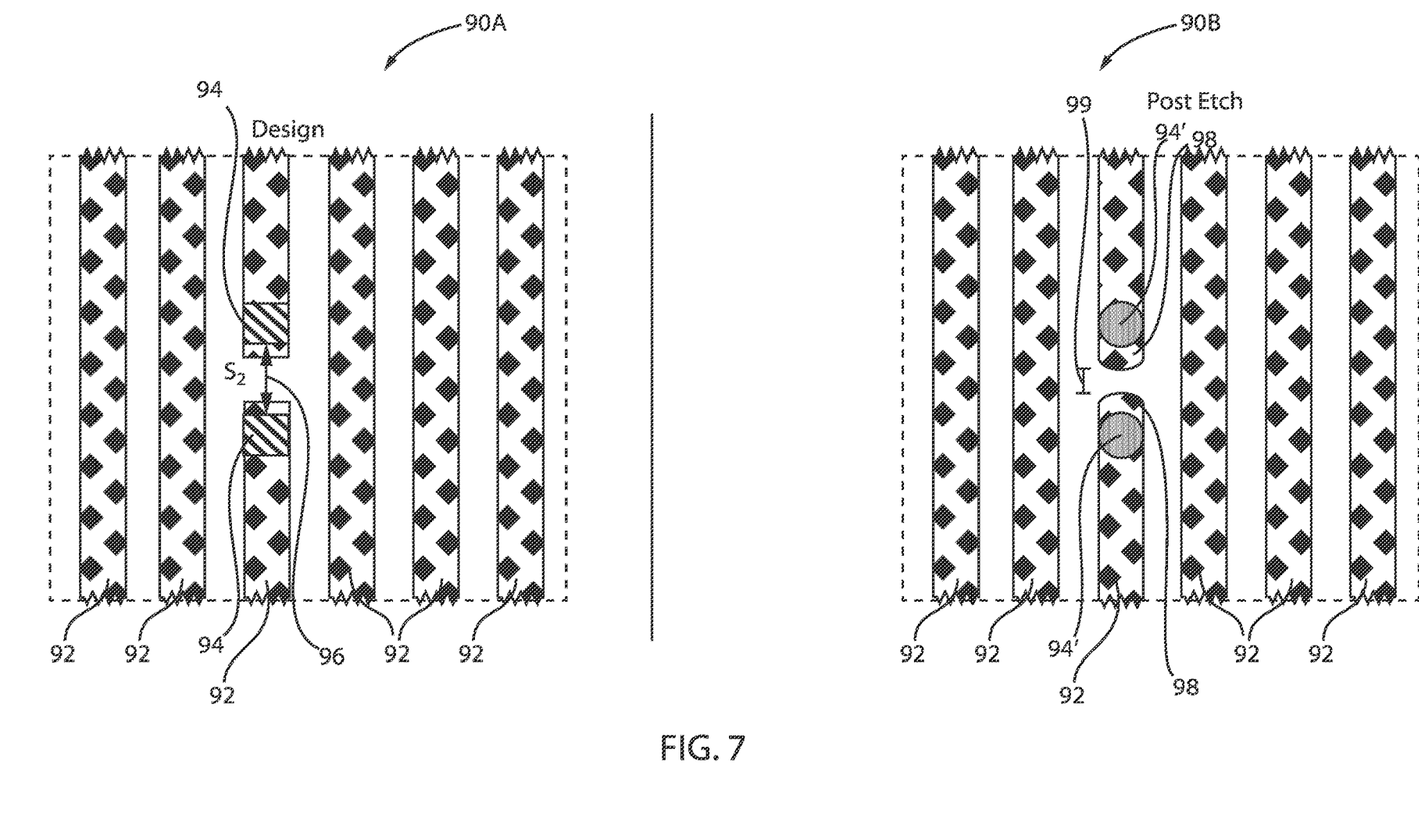
FIG. 7 is a top view illustrating a tighter tip-to-tip without a mask cut, in accordance with an embodiment of the present invention.

FIG. 7 is a top view illustrating a tighter tip-to-tip without a mask cut, in accordance with an embodiment of the present invention.

In various example embodiments, top view 90A illustrates metal lines 92, as well as vias 94. A distance 96 between vias 94 is depicted. Top view 90B illustrates metal lines 92, as well as vias 94', where a distal end 98 of the metals lines 92 is rounded such that a distance 99 between the tips of distal ends 98 is less than distance 96. In other words, the metal lines 92 are closer to each other in top view 90B. Thus, tighter tip-to-tip is enabled without a mask cut.

Figure 8:
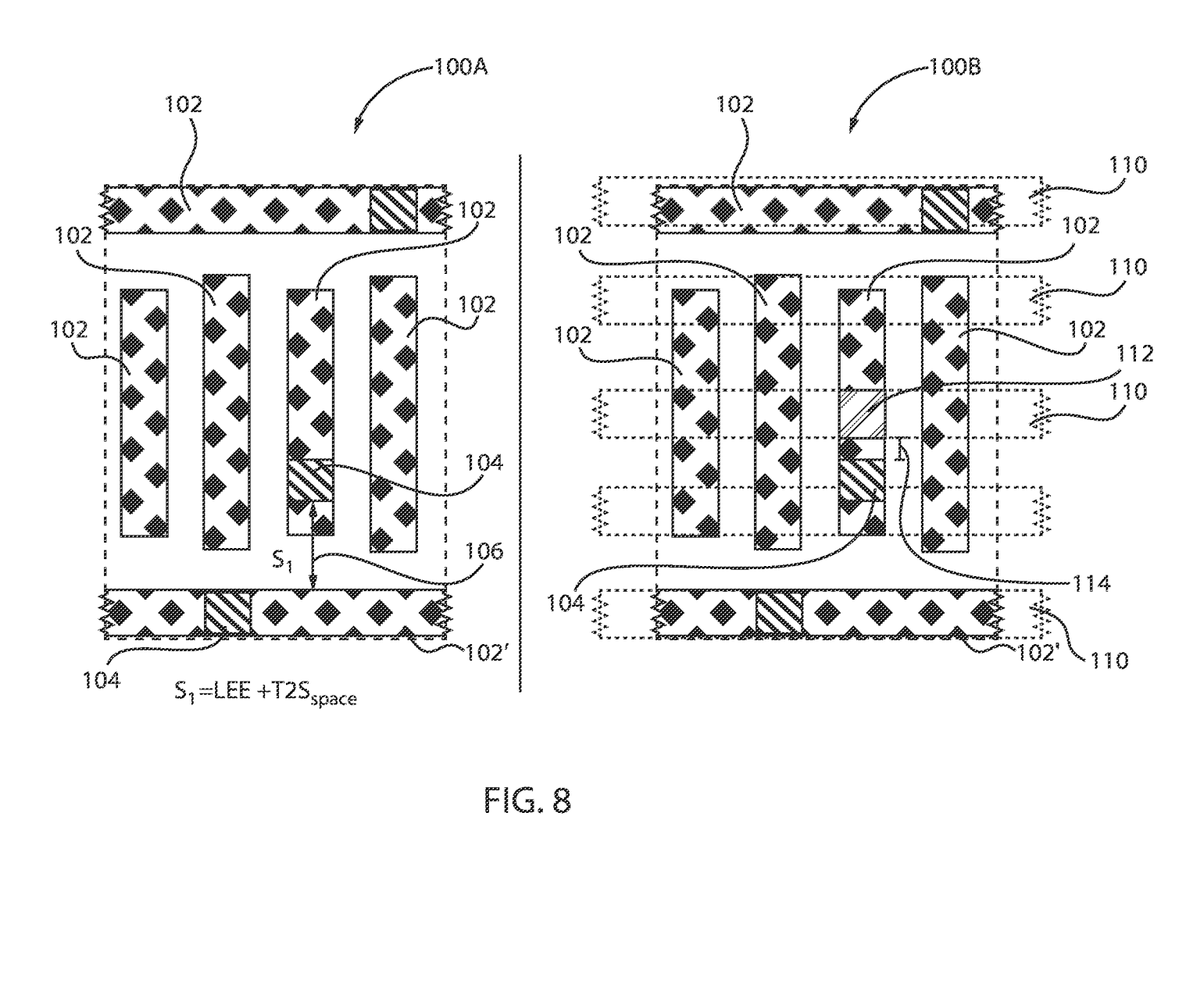
FIG. 8 is a top view illustrating a tip-to-side rail construct, in accordance with an embodiment of the present invention.

FIG. 8 is a top view illustrating a tip-to-side rail construct, in accordance with an embodiment of the present invention.

In various example embodiments, top view 100A illustrates metal lines 102 and vias 104. A distance 106 between via 104 and side rail 102' is shown as $S_1$. Top view 100B illustrates another metal layer 110 above the metal lines 102, 102'. The via 104 is forced to move to position 112, away from the rail 102'. The via move or shift is shown by arrow 114.

The reduction in $S_1$ space improves area scaling, allows usage of additional metal tracks, and spacer pinch off can be used for the tip-to-side construct.

In summary, the exemplary embodiments of the present invention introduce a structure including a pair of tip-to-tip oriented metal lines with via at the end where the trench edges are formed by a spacer deposition and where the dielectric spacer is connected and pinched off between the two metal lines to isolate the trenches with a dielectric. The structure's spacer deposition is a dielectric to isolate the two line-ends electrically. In an alternate embodiment, a dielectric can replace the spacer in a follow-on process with the spacer being a sacrificial material. The exemplary embodiments of the present invention further introduce a method where a small stitching structure is formed on a mask (creating a jogged target) to reduce via line-end enclosure requirements without an additional masking (cut) layer and where, after a series of processing steps, a spacer is deposited where the spacer is merged in the regions where the combined patterning target is created to enable isolation between two metal lines.

Therefore, the exemplary embodiments of the present invention introduce systems and methods for modifying design data to create a merged spacer that defines dense tip-to-tip and tip-to-side constructs without the need for an additional mask level, and where the minimum space is defined by a minimum spacer.

Regarding FIGS. 1-4, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

A pre-clean wet etch process, such as a buffered hydrofluoric acid (BHF) etch, is a material removal process that uses liquid chemicals or etchants to remove materials from a surface. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for denser active via spacing without use of a cut mask (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a semiconductor structure, the method comprising:
    forming a barrier layer on a substrate;
    forming a cap layer on the barrier layer;
    forming a mandrel layer on the cap layer;
    forming sacrificial hardmask layers over the mandrel layer defining a litho stack;
    creating a pattern in the litho stack having a narrow section connecting two wider sections in an hour glass geometry;
    depositing a spacer assuming a shape of the hour glass pattern; and
    etching the litho stack to expose the mandrel layer and areas of the cap layer, wherein separate exposed areas of the barrier layer include respective pointed distal tips aligned with each other such that a space is defined directly between the pointed distal tips.

2. The method of claim 1, wherein the spacer is deposited using ALD such that sides of the spacer merge.

3. The method of claim 2, wherein the spacer establishes a distance between the pointed distal tips.

4. The method of claim 1, wherein a tip-to-tip distance between the pointed distal tips is 39.4 nanometers (nm).

5. The method of claim 1, wherein sidewalls of each of the exposed areas of the barrier layer converge to form a single respective point at the distal end of each exposed area.

6. The method of claim 1, wherein the barrier layer is formed from titanium nitride.

7. The method of claim 1, wherein forming the hardmask layers includes forming a first hardmask layer on the mandrel layer, forming a second hardmask layer on the first hardmask layer, and forming a third hardmask layer on the second hardmask layer.

8. The method of claim 7, wherein each of the first hardmask layer, the second hardmask layer, and the third hardmask layer is formed from a different material.

9. The method of claim 7, wherein creating a pattern in the litho stack includes selectively forming the pattern in only the third hardmask layer, before depositing the spacer.

10. The method of claim 9, wherein etching the litho stack includes etching into the first hardmask layer, the second hardmask layer, and the mandrel layer using the spacer as a mask, leaving remaining portions of the first hardmask layer and the second hardmask layer on remaining portions of the mandrel layer.

11. The method of claim 9, further comprising stripping the remaining portions of the first hardmask layer and the second hardmask layer and stripping portions of the cap layer to expose the barrier layer.

12. The method of claim 1, wherein the cap layer is an insulating material containing nitrogen.

13. A method for forming a semiconductor structure, the method comprising:
    forming a barrier layer;
    forming a cap layer on the barrier layer;
    creating a pattern in a litho stack formed over the barrier layer, the pattern having a narrow section connecting two wider sections in an hour glass geometry;
    depositing a spacer assuming a shape of the pattern; and
    etching the litho stack to expose separate areas of the cap layer including respective pointed distal tips aligned with each other such that a space is defined directly between the pointed distal tips.

14. The method of claim 13, wherein the spacer is deposited using ALD such that sides of the spacer merge.

15. The method of claim 14, wherein the spacer enables isolation between the pointed distal tips.

16. The method of claim 15, wherein a tip-to-tip distance between the pointed distal tips is 39.4 nanometers (nm).

* * * * *